United States Patent
Hu

(10) Patent No.: US 11,316,109 B2
(45) Date of Patent: Apr. 26, 2022

(54) PATTERNED PEROVSKITE FILM, PREPARATION METHOD THEREOF, AND DISPLAY DEVICE

(71) Applicant: SHENZHEN CHINA STAR OPTOELECTRONICS SEMICONDUCTOR DISPLAY TECHNOLOGY CO., LTD., Shenzhen (CN)

(72) Inventor: Zhiping Hu, Shenzhen (CN)

(73) Assignee: SHENZHEN CHINA STAR OPTOELECTRONICS SEMICONDUCTOR DISPLAY TECHNOLOGY CO., LTD., Shenzhen (CN)

(*) Notice: Subject to any disclaimer, the term of this patent is extended or adjusted under 35 U.S.C. 154(b) by 286 days.

(21) Appl. No.: 16/624,421

(22) PCT Filed: Dec. 11, 2019

(86) PCT No.: PCT/CN2019/124445
§ 371 (c)(1),
(2) Date: Dec. 19, 2019

(87) PCT Pub. No.: WO2021/103144
PCT Pub. Date: Jun. 3, 2021

(65) Prior Publication Data
US 2021/0359206 A1 Nov. 18, 2021

(30) Foreign Application Priority Data
Nov. 28, 2019 (CN) .......... 201911188992.4

(51) Int. Cl.
*H01L 51/40* (2006.01)
*H01L 51/00* (2006.01)
*H01L 51/52* (2006.01)

(52) U.S. Cl.
CPC ........ *H01L 51/0003* (2013.01); *H01L 51/009* (2013.01); *H01L 51/5253* (2013.01)

(58) Field of Classification Search
CPC .......... H01L 51/0003; H01L 51/009; H01L 51/5253
See application file for complete search history.

(56) References Cited

U.S. PATENT DOCUMENTS

| 2007/0215856 A1 | 9/2007 | Kwon et al. |
| 2008/0206565 A1 | 8/2008 | Takahashi et al. |
| 2020/0144527 A1 | 5/2020 | Angioni et al. |
| 2020/0152486 A1* | 5/2020 | Kim ................ H01L 21/02118 |

FOREIGN PATENT DOCUMENTS

| CN | 109306265 A | 2/2019 |
| CN | 110041906 A | 7/2019 |
| CN | 110311044 A | 10/2019 |

* cited by examiner

*Primary Examiner* — Dale E Page
*Assistant Examiner* — Colleen E Snow
(74) *Attorney, Agent, or Firm* — Dickinson Wright PLLC

(57) ABSTRACT

The present invention discloses a patterned perovskite film, a preparation method thereof, and a display device. The method includes mixing a perovskite precursor and a photo-initiated polymer monomer, and realizing polymerization of a part of a predetermined area under shielding of a photomask, that is, the formed perovskite crystals are encapsulated by the formed polymer with formation of the patterned perovskite film.

14 Claims, 3 Drawing Sheets

```
┌─────────────────────────────────────────────────┐
│ mixing a perovskite precursor, a monomer, a photoinitiator, and │  S1
│ a crosslinker, to form a pre-polymerized mixed colloid solution; │
└─────────────────────────────────────────────────┘
                        ⇩
┌─────────────────────────────────────────────────┐
│ coating a layer of photoresist on a substrate, and patterning the │  S2
│ photoresist by exposure and development, to form a retaining │
│ wall; │
└─────────────────────────────────────────────────┘
                        ⇩
┌─────────────────────────────────────────────────┐
│ coating the pre-polymerized mixed colloid solution on the │
│ substrate on which the retaining wall is formed, to form a pre- │  S3
│ polymerized mixture layer; │
└─────────────────────────────────────────────────┘
                        ⇩
┌─────────────────────────────────────────────────┐
│ irradiating the pre-polymerized mixture layer with ultraviolet │
│ light under shielding of a photomask, to form a partially │  S4
│ polymerized mixture layer; │
└─────────────────────────────────────────────────┘
                        ⇩
┌─────────────────────────────────────────────────┐
│ spraying a first organic solvent to the partially polymerized │
│ mixture layer, dissolving and removing an unpolymerized │  S5
│ portion of partially polymerized mixture layer, to form a │
│ polymerized mixture layer; and │
└─────────────────────────────────────────────────┘
                        ⇩
┌─────────────────────────────────────────────────┐
│ removing the first organic solvent in the polymerized mixture │  S6
│ layer, to form the patterned perovskite film. │
└─────────────────────────────────────────────────┘
```

FIG. 1

PATTERNED PEROVSKITE FILM, PREPARATION METHOD THEREOF, AND DISPLAY DEVICE

BACKGROUND OF INVENTION

The present application claims priority to Chinese patent application no. 201911188992.4 submitted to Chinese Patent Office on Nov. 28, 2019, entitled "patterned perovskite film, preparation method thereof, and display device", the entire contents of which are incorporated herein by reference.

Field of Invention

The present application relates to a field of optoelectronic display, in particular to a patterned perovskite film, a preparation method thereof, and a display device.

Description of Prior Art

Perovskite materials were first discovered by scientist Gustav Rose in 1839, and were named after Tsarist mineralogist Lev Perovski. Because the earliest discovered perovskite materials are calcium and titanium composite oxides, and thus were called "calcium-titanium mineral" in Chinese. Later, perovskite did not only refer to this calcium and titanium composite oxide, but used to refer to a series of compounds with a chemical formula $ABX_3$.

In recent years, the perovskite materials have attracted much attention due to their low toxicity, simple synthesis and excellent optical properties. Since external quantum efficiency of electroluminescent diodes based on the perovskite materials has reached the light-emitting efficiency of organic light emitting diodes in a short time, development potential of the perovskite materials in the display field is exhibited. However, sensitivity of the perovskite materials to water and oxygen severely limits its industrial application in the display field. At present, the biggest difficulty in industrialization of the perovskite materials lies in poor stability and difficulty in patterning of the perovskite materials.

The present application provides a patterned perovskite film, a preparation method thereof, and a display device, wherein by using a polymer to encapsulate a perovskite material, stability of the perovskite material can be improved, and meanwhile, with a help of a photomask, selective polymerization is achieved, thereby realizing patterning of the perovskite film.

SUMMARY OF INVENTION

In a first aspect, the present invention provides a method of preparing a perovskite-patterned film, including:

S1: mixing a perovskite precursor, a monomer, a photoinitiator, and a crosslinker, to form a pre-polymerized mixed colloid solution;

S2: coating a layer of photoresist on a substrate, and patterning the photoresist by exposure and development, to form a retaining wall;

S3: coating the pre-polymerized mixed colloid solution on the substrate on which the retaining wall is formed, to form a pre-polymerized mixture layer;

S4: irradiating the pre-polymerized mixture layer with ultraviolet light under shielding of a photomask, to form a partially polymerized mixture layer;

S5: spraying a first organic solvent to the partially polymerized mixture layer, dissolving and removing an unpolymerized portion of partially polymerized mixture layer, to form a polymerized mixture layer; and S6: removing the first organic solvent in the polymerized mixture layer, to form the patterned perovskite film.

In the method of preparing the patterned perovskite film provided by the present invention, a molar ratio of the perovskite precursor, the monomer, the photoinitiator, and the crosslinker is: 1:(3-5):(1-2):(1-2).

In the method of preparing the patterned perovskite film provided by the present invention, the perovskite precursor includes at least two metal halides.

In the method of preparing the patterned perovskite film provided by the present invention, the at least two metal halides are selected from at least two of cesium bromide, lead bromide, cesium iodide, and lead iodide.

In the method of preparing the patterned perovskite film provided by the present invention, the perovskite precursor includes at least one metal halide and at least one alkyl ammonium halide.

In the method of preparing the patterned perovskite film provided by the present invention, the at least one metal halide is selected from at least one of cesium bromide, lead bromide, cesium iodide, and lead iodide, and the at least one alkyl ammonium halide is selected from at least one of methyl ammonium bromide, ethyl ammonium bromide, methyl ammonium iodide, and ethyl ammonium iodide.

In the method of preparing the patterned perovskite film provided by the present invention, the monomer includes acrylate and styrene, the photoinitiator is methylphenylacetone, and the cross-linking agent is methylenebisacrylamide.

In the method of preparing the patterned perovskite film provided by the present invention, in the step S5 and the step S6, the first organic solvent is toluene.

In the method of preparing the patterned perovskite film provided by the present invention, in the step S1, the perovskite precursor is first dissolved in a second organic solvent to obtain a perovskite precursor solution, and then the perovskite precursor solution is mixed with the monomer, the photoinitiator, and the cross-linking agent to form the pre-polymerized mixed colloid solution.

In the method of preparing the patterned perovskite film provided by the present invention, the second organic solvent is dimethylamide.

In the method of preparing the patterned perovskite film provided by the present invention, the retaining wall is provided with a blank area therein, and the patterned perovskite film is formed within the blank area.

In the method of preparing the patterned perovskite film provided by the present invention, the pre-polymerized mixture layer has a thickness greater than a height of the retaining wall.

In the method of preparing the patterned perovskite film provided by the present invention, in the step S4, an orthographic projection of a shielding area of the photomask on the substrate is located within an orthographic projection of the retaining wall on the substrate.

In another aspect the present invention also provides a patterned perovskite film, which is prepared by using the aforementioned method of preparing a patterned perovskite film.

In still another aspect, the present invention also provides a display device, including a light-emitting material layer, the light-emitting material layer including the aforementioned patterned perovskite film.

Compared with the prior art, the present invention uses a photo-curable polymer as a carrier and a protective shell of the perovskite. Specifically, after a perovskite precursor is mixed in a polymer system to form the polymer by photo-initiated polymerization, the perovskite material is wrapped in the formed polymer, so that the perovskite material is isolated from water and oxygen in the air, and the stability of the perovskite material is effectively improved; and meanwhile, a specific area of the polymer is polymerized by using a photomask, to realize patterning of perovskite.

BRIEF DESCRIPTION OF DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

FIG. 1 is a schematic text flow of a method of preparing a patterned perovskite film according to an embodiment of the present invention.

DETAILED DESCRIPTION OF PREFERRED EMBODIMENTS

Figure 2A:
FIGS. 2A-2F are schematic structural flow diagrams of a method of preparing a patterned perovskite film according to an embodiment of the present invention.

The technical solutions in the embodiments of the present application will be clearly and completely described in the following with reference to the accompanying drawings in the embodiments. It is apparent that the described embodiments are only a part of the embodiments of the present application, and not all of them. All other embodiments obtained by a person skilled in the art based on the embodiments of the present application without creative efforts are within the scope of the present application.

In the description of the present invention, it is to be understood that the terms "center", "longitudinal", "transverse", "length", "width", "thickness", "upper", "lower", "front", "post", "left", "right", "vertical", "horizontal", "top", "bottom", "inside", "outside", etc. demonstrating the orientation or positional relationship of the indications is based on the orientation shown in the drawings Or, the positional relationship is merely for the convenience of the description of the present invention and the simplification of the description, and is not intended to imply that the device or the component of the present invention has a specific orientation and is constructed and operated in a specific orientation, thus being not to be construed as limiting the present invention. Moreover, the terms "first" and "second" are used for descriptive purposes only and are not to be construed as indicating or implying a relative importance or not to implicitly indicate a number of technical features indicated. Thus, features defined by "first" or "second" may include one or more of the described features either explicitly or implicitly. In the description of the present invention, the meaning of "a plurality" is two or more unless specifically defined otherwise.

An embodiment of the present invention provides a method of preparing a perovskite patterned thin film. Please refer to FIG. 1 and FIGS. 2A-2F. The method includes:

S1: mixing a perovskite precursor, a monomer, a photoinitiator, and a crosslinker, to form a pre-polymerized mixed colloid solution.

In the above, a molar ratio of the perovskite precursor, the monomer, the photoinitiator, and the crosslinker is: 1:(3-5):(1-2):(1-2). For example, in the pre-polymerized mixed colloid solution, the perovskite precursor is present in an amount of 15 mol %, the monomer is present in an amount of 50 mol %, the photoinitiator is present in an amount of 15 mol %, and the crosslinker is present in an amount of 20 mol %.

A proper proportion of polymer plays a good water and oxygen barrier function without impacting the good photoelectric performance of the formed patterned perovskite film.

In addition, the perovskite precursor includes at least two metal halides to form a pure inorganic perovskite. The metal halide may generally be cesium bromide, cesium iodide, lead bromide, or lead iodide.

Alternatively, the perovskite precursor includes at least one metal halide and at least one alkyl ammonium halide to form an organic-inorganic composite perovskite. The metal halide may generally be cesium bromide, cesium iodide, lead bromide, or lead iodide, and the alkyl ammonium halide may generally be methyl ammonium bromide, ethyl ammonium bromide, methyl ammonium iodide, or ethyl ammonium iodide.

In an embodiment, the perovskite precursor is $CH_3NH_3Br$ and $PbBr_2$, which can form a nanocrystalline perovskite material of CH3NH3PbBr3, wherein a molar ratio of the added $CH_3NH_3Br$ and $PbBr_2$ can generally be 1:1;

In another embodiment, the perovskite precursor is CsBr and $PbBr_2$, which can form a nanocrystalline perovskite material of $CsPbBr_3$, wherein a molar ratio of the added CsBr and $PbBr_2$ can generally be 1:1;

In another embodiment, the perovskite precursors are $CH_3NH_3Br$, $PbBr_2$, and $PbI_2$, which can form a nanocrystalline perovskite material of CH3NH3Pb(Br/I)3, wherein a molar ratio between the added CH3NH3Br and $PbBr_2$ or $PbI_2$ can generally be 1:1. By adding a certain proportion of $PbI_2$ to the precursor, a luminous band and the luminous color of the perovskite material can be changed, and specifically, the luminous band of the nanocrystalline perovskite material of $CH_3NH_3PbBr_3$ is in the green light band; while by adding a certain proportion of PbI2 to the precursor, the luminous band of the formed nanocrystalline perovskite material of $CH_3NH_3Pb(Br/I)_3$ is located in the red light band. That is, by changing the type and content of halogens in the precursor, the perovskite material with a desired luminous color can be prepared.

Further, the monomer may generally include acrylate and styrene to polymerize to form an acrylic resin. It can be understood that the type of the polymer in the present invention is not particularly limited, and may be other polymer systems.

The photoinitiator may be methylphenylacetone, and the crosslinker may be methylenebisacrylamide.

In a preferred embodiment, in the step S1, the perovskite precursor is first dissolved in a second organic solvent to obtain a perovskite precursor solution, and then the perovskite precursor solution is mixed with the monomer, the photoinitiator, and the cross-linking agent to form the pre-polymerized mixed colloid solution, wherein the second organic solvent may generally be dimethylamide (DMF), which has better solubility for the perovskite precursor and the polymer system, resulting in better uniformity of the prepared patterned perovskite film.

S2: coating a layer of photoresist on a substrate 10, and patterning the photoresist by exposure and development, to form a retaining wall 20, that is, the structure shown in FIG. 2A, wherein the retaining wall 20 is provided with a blank area therein, which is configured to assist the patterning the perovskite film, and finally, the patterned perovskite film is formed within a blank area of the retaining wall 20.

Figure 2B:
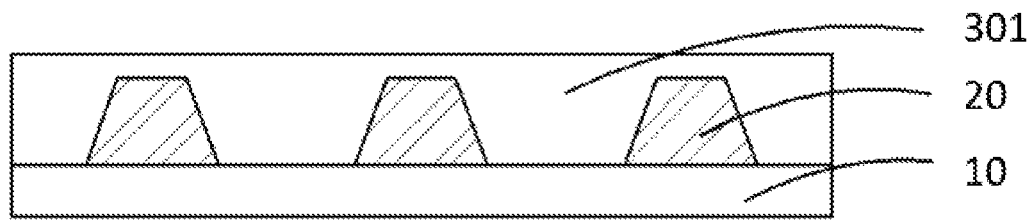

S3: coating the pre-polymerized mixed colloid solution on the substrate 10 on which the retaining wall 20 is formed, to form a pre-polymerized mixture layer 301, that is, a structure shown in FIG. 2B, wherein the pre-polymerized mixture layer 301 has a thickness greater than a height of the retaining wall 20, that is, the pre-polymerized mixture layer 301 completely fills the blank area in the retaining wall 20 and completely covers the retaining wall.

Figure 2C:
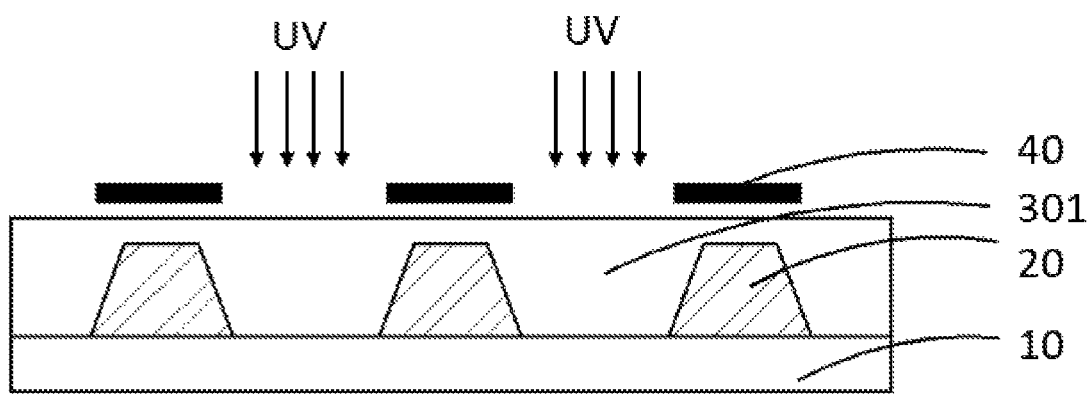
Figure 2D:
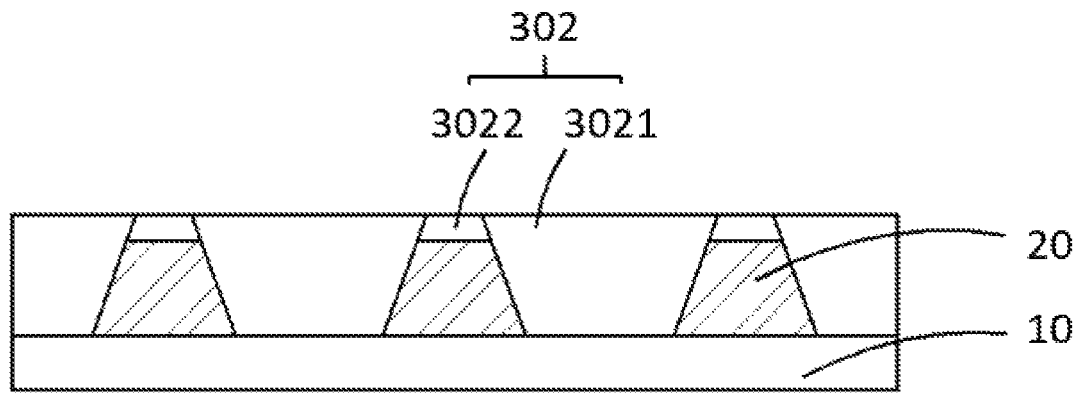

S4: irradiating the pre-polymerized mixture layer 301 with ultraviolet light under shielding of a photomask 40, to form a partially polymerized mixture layer 302, as shown in FIG. 2C, which including a polymerized portion 3021 and an unpolymerized portion 3022, as shown in FIG. 2D.

The area shielded by the photomask 40 is located directly above the retaining wall 20, that is, an orthographic projection of a shielding area of the photomask 40 on the substrate 10 is located within an orthographic projection of the retaining wall 20 on the substrate 10, so that the unshielded place is excited by ultraviolet light, and the monomers are polymerized to form a polymer under an action of a photoinitiator and a cross-linking agent. During forming the polymer, the polymer encapsulate the perovskite precursor uniformly in its interior, and the area shielded by the photomask is not excited by ultraviolet light, such that the polymerization reaction cannot be initiated, that is, a partially polymerized mixture layer 302 including a polymerized portion 3021 and an unpolymerized portion 3022 is formed.

Figure 2E:
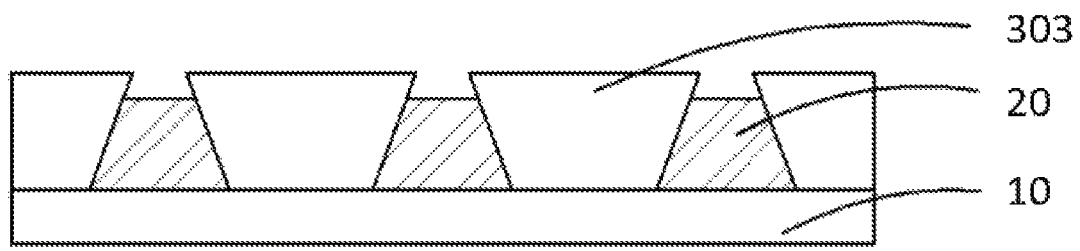

S5: spraying a first organic solvent to the partially polymerized mixture layer 302, dissolving and removing an unpolymerized portion 3022, to form a polymerized mixture layer 303, that is, the structure shown in FIG. 2E.

In this case, the first organic solvent may be toluene, which has a good solubility for the monomer, and during spraying, the unpolymerized portion 3022 is dissolved and removed by toluene. In addition, due to formation of voids inside the formed polymer, toluene easily flows into the polymer, and the perovskite precursor included in the polymer has low solubility in toluene, and is extremely easily precipitated and crystallized to form a perovskite nanocrystal.

Figure 2F:
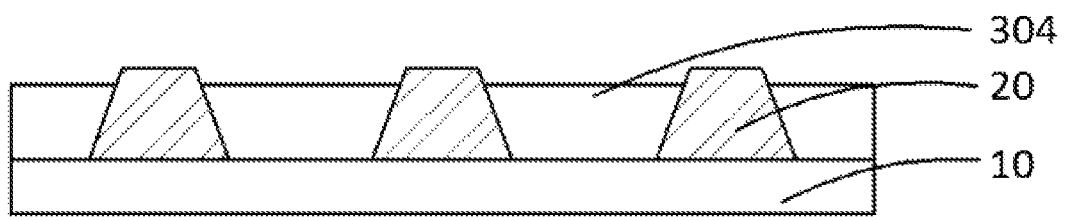

S6: removing the first organic solvent in the polymerized mixture layer 303, to form the patterned perovskite film 304, as shown in FIG. 2F.

The first organic solvent in the polymer mixture layer 303 may be removed generally be vacuum evaporation, and after the solvent is removed, the patterned perovskite film 304 has a thickness smaller than a height of the retaining wall 20.

In summary, by using a polymer to encapsulate a perovskite material, the perovskite material is isolated from the external water and oxygen to improve the stability of the perovskite material. On the other hand, in order to achieve the patterning of the perovskite material, a photoresist is used to form a specific pattern of the retaining wall to assist in patterning first. In essence, the blank area in the retaining wall is the area where a pattern of the patterned perovskite film is disposed. In addition, the combination of photomask and photo-initiated polymerization further realizes the patterning of the perovskite film, that is, the area shielded by the photomask is not polymerized and readily removable, while the area unshielded by the photomask is polymerized to form the corresponding pattern, thereby achieving patterning.

Another embodiment of the present invention also provides a patterned perovskite film, which is prepared by using the aforementioned method of preparing the patterned perovskite film.

Another embodiment of the present invention further provides a display device, including the aforementioned patterned perovskite film.

In the display device, the perovskite-patterned film can be used as a light-emitting material layer for achieving electroluminescence.

In addition, the patterned perovskite film can also be used as a light conversion layer according to a principle of photoluminescence, which, after being excited by the backlight, can realize emission of various required colors and achieve a color display with a high-quality display effect.

In the above embodiments, the description of each embodiment has its own emphasis, and the parts that are not described in detail in an embodiment can be referred to the detailed descriptions of other embodiments above, which will not be repeated herein for brevity.

A patterned perovskite film, a preparation method thereof, and a display device provided by the embodiments of the present invention have been described in detail above. Specific examples are used in this document to explain the principles and implementation of the present invention. The descriptions of the above embodiments are only for understanding the method of the present invention and its core idea; Meanwhile, for those skilled in the art, according to the idea of the present invention, there will be changes in the specific implementation and application scope. In summary, the content of this specification should not be construed as a limitation on the present invention.

What is claimed is:

1. A method of preparing a patterned perovskite film, comprising:

S1: mixing a perovskite precursor, a monomer, a photoinitiator, and a crosslinker, to form a pre-polymerized mixed colloid solution;

S2: coating a layer of photoresist on a substrate, and patterning the photoresist by exposure and development, to form a retaining wall;

S3: coating the pre-polymerized mixed colloid solution on the substrate on which the retaining wall is formed, to form a pre-polymerized mixture layer;

S4: irradiating the pre-polymerized mixture layer with ultraviolet light under shielding of a photomask, to form a partially polymerized mixture layer;

S5: spraying a first organic solvent to the partially polymerized mixture layer, dissolving and removing an unpolymerized portion of partially polymerized mixture layer, to form a polymerized mixture layer; and S6: removing the first organic solvent in the polymerized mixture layer, to form the patterned perovskite film, wherein a molar ratio of the perovskite precursor to the monomer to the photoinitiator to the crosslinker is: 1:(3-5):(1-2):(1-2).

2. The method of preparing the patterned perovskite film according to claim 1, wherein the perovskite precursor comprises at least two metal halides.

3. The method of preparing the patterned perovskite film according to claim 2, wherein the at least two metal halides are selected from at least two of cesium bromide, lead bromide, cesium iodide, and lead iodide.

4. The method of preparing the patterned perovskite film according to claim 1, wherein the perovskite precursor comprises at least one metal halide and at least one alkyl ammonium halide.

5. The method of preparing the patterned perovskite film according to claim 4, wherein the at least one metal halide is selected from at least one of cesium bromide, lead bromide, cesium iodide, and lead iodide, and the at least one alkyl ammonium halide is selected from at least one of methyl ammonium bromide, ethyl ammonium bromide, methyl ammonium iodide, and ethyl ammonium iodide.

6. The method of preparing the patterned perovskite film according to claim 1, wherein the monomer comprises acrylate and styrene, the photoinitiator is methylphenylacetone, and the cross-linking agent is methylenebisacrylamide.

7. The method of preparing the patterned perovskite film according to claim 1, wherein in the step S5 and the step S6, the first organic solvent is toluene.

8. The method of preparing the patterned perovskite film according to claim 1, wherein in the step S1, the perovskite precursor is first dissolved in a second organic solvent to obtain a perovskite precursor solution, and then the perovskite precursor solution is mixed with the monomer, the photoinitiator, and the cross-linking agent to form the pre-polymerized mixed colloid solution.

9. The method of preparing the patterned perovskite film according to claim 8, wherein the second organic solvent is dimethylamide.

10. The method of preparing the patterned perovskite film according to claim 1, wherein the retaining wall is provided with a blank area therein, and the patterned perovskite film is formed within the blank area.

11. The method of preparing the patterned perovskite film according to claim 1, wherein the pre-polymerized mixture layer has a thickness greater than a height of the retaining wall.

12. The method of preparing the perovskite-patterned film according to claim 1, wherein, in the step S4, an orthographic projection of a shielding area of the photomask on the substrate is located within an orthographic projection of the retaining wall on the substrate.

13. A patterned perovskite film, prepared by the method of preparing the patterned perovskite film according to claim 1.

14. A display device, comprising a light-emitting material layer, the light-emitting material layer comprising the patterned perovskite film according to claim 13.

* * * * *